United States Patent
Fan et al.

(10) Patent No.: US 9,502,513 B2
(45) Date of Patent: Nov. 22, 2016

(54) NON-VOLATILE MEMORY DEVICE AND MANUFACTURE OF THE SAME

(71) Applicant: Xinnova Technology Limited, Beijing (CN)

(72) Inventors: Der-Tsyr Fan, Taoyuan County (TW); Chih-Ming Chen, Hsin-chu County (TW); Jung-Chang Lu, Hsin-chu (TW)

(73) Assignee: XINNOVA TECHNOLOGY LIMITED, Beijing (CN)

( * ) Notice: Subject to any disclaimer, the term of this patent is extended or adjusted under 35 U.S.C. 154(b) by 0 days.

(21) Appl. No.: 15/011,516

(22) Filed: Jan. 30, 2016

(65) Prior Publication Data

US 2016/0240622 A1 Aug. 18, 2016

Related U.S. Application Data

(60) Provisional application No. 62/116,776, filed on Feb. 16, 2015.

(51) Int. Cl.
| | | |
|---|---|---|
| H01L 21/00 | (2006.01) | |
| H01L 29/423 | (2006.01) | |
| H01L 29/788 | (2006.01) | |
| H01L 21/28 | (2006.01) | |
| H01L 29/66 | (2006.01) | |

(52) U.S. Cl.
CPC ... *H01L 29/42328* (2013.01); *H01L 21/28273* (2013.01); *H01L 29/66825* (2013.01); *H01L 29/7883* (2013.01)

(58) Field of Classification Search
CPC .................. H01L 29/42328; H01L 21/28273; H01L 29/7883; H01L 29/66825
See application file for complete search history.

(56) References Cited

U.S. PATENT DOCUMENTS

| | | | |
|---|---|---|---|
| 9,219,125 B2* | 12/2015 | Chen | H01L 29/78 |
| 9,330,922 B2* | 5/2016 | Toren | H01L 21/28273 |
| 2005/0087892 A1* | 4/2005 | Hsu | H01L 27/11521 257/296 |
| 2005/0207199 A1* | 9/2005 | Chen | G11C 16/0425 365/51 |
| 2009/0039410 A1* | 2/2009 | Liu | H01L 21/28273 257/320 |
| 2013/0234223 A1* | 9/2013 | Toren | H01L 21/28273 257/316 |
| 2014/0140138 A1* | 5/2014 | Tran | G11C 16/0483 365/185.18 |
| 2014/0183612 A1* | 7/2014 | Chen | H01L 27/11524 257/315 |
| 2014/0361358 A1* | 12/2014 | Chen | H01L 27/11524 257/315 |
| 2015/0214315 A1* | 7/2015 | Fan | H01L 27/11521 257/321 |
| 2015/0243795 A1* | 8/2015 | Fan | H01L 29/42328 257/321 |
| 2015/0263010 A1* | 9/2015 | Chuang | H01L 27/11534 257/319 |
| 2016/0104711 A1* | 4/2016 | Hsu | G11C 16/14 257/300 |
| 2016/0204272 A1* | 7/2016 | Fan | H01L 29/7883 257/319 |
| 2016/0204273 A1* | 7/2016 | Fan | H01L 29/7883 257/319 |
| 2016/0204274 A1* | 7/2016 | Fan | H01L 29/7883 257/319 |

* cited by examiner

*Primary Examiner* — Laura Menz
(74) *Attorney, Agent, or Firm* — Chun-Ming Shih

(57) ABSTRACT

This disclosure discloses a non-volatile memory component and a manufacture method of the same. The non-volatile memory component includes a substrate, a first dielectric layer on the substrate, an erase gate (EG), a floating gate (FG) and a select gate (EG). The substrate includes a source region and a drain region. The erase gate (EG), the floating gate (FG) and the select gate (EG) are formed on the first dielectric layer. Additionally, non-volatile memory component includes a coupling dielectric layer formed in the intervals and the upper region of the erase gate (EG), the floating gate (FG) and the select gate (SG), and a coupling gate (CG) formed on the coupling dielectric layer.

20 Claims, 11 Drawing Sheets

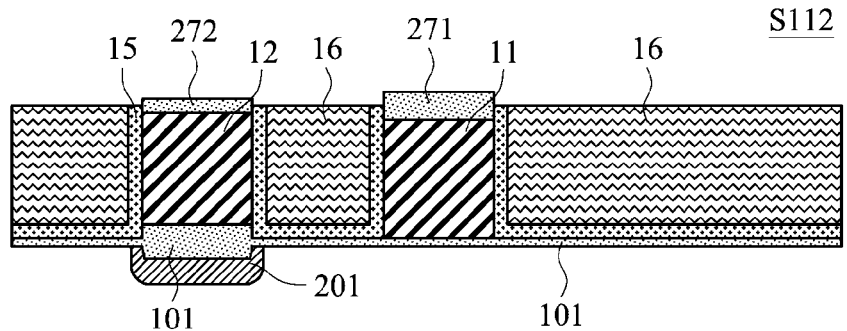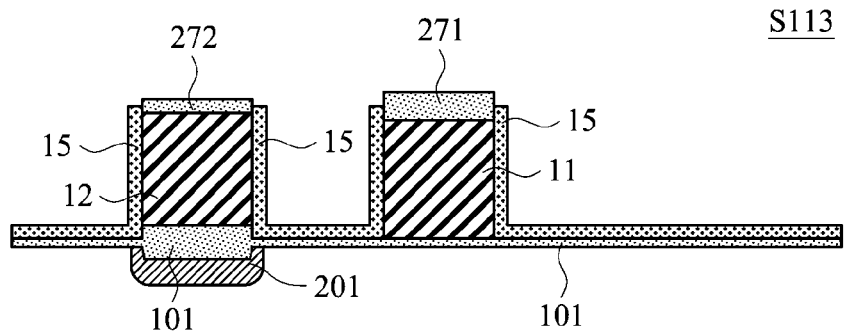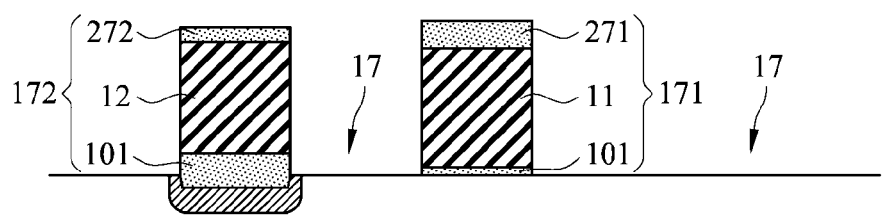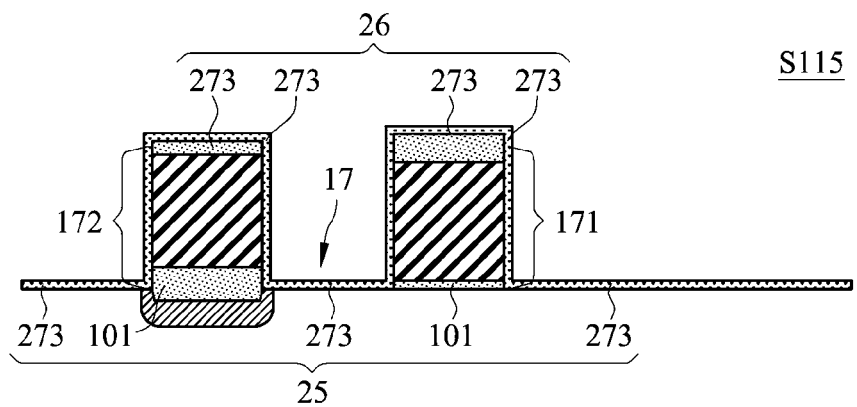

NON-VOLATILE MEMORY DEVICE AND MANUFACTURE OF THE SAME

CROSS-REFERENCE TO RELATED APPLICATIONS

This application claims an invention which was disclosed in Provisional Application No. 62/116,776, filed on Feb. 16, 2015, entitled "WORDLINE-FIRST DAMASCENE SPLIT GATE NON-VOLATILE MEMORY". The benefit under 35 USC §119 (e) of the United States provisional application is hereby claimed, and the aforementioned application is hereby incorporated herein by reference.

BACKGROUND

1. Technical Field

This disclosure discloses a non-volatile memory, in particular, to a non-volatile memory component and a method for manufacturing a floating gate by employing a damascene trench formed by an erase gate (EG) and a select gate (SG).

2. Related Art

Split-gate non-volatile memory components are widely applied on independent and embedded non-volatile application. Because of it has the features that smaller sector erasure and easy circuit design support, split-gate become more and more important in the IC industry.

About the split-gate non-volatile memory components technology in the market, such as the double-polysilicon split gate, which is well-approved by end-users because of its reliable stability and produce easily, of Microchip and SST company. This technology employs two polysilicon layers. The first polysilicon is the floating gate (FG) while the second polysilicon is the select gate. However, the dimension of IC device become more and more small, but double-polysilicon needs large area for the diffusion of source region and floating gate coupling. The double-polysilicon split gate will not meet the dimension diminution requirement in the near future.

The spilt-gate memory dimension can be scaled down by adding an additional polysilicon layer to form a coupling gate (for example, control gate), so the three-layer-polysilicon split-gate becomes more and more important. This technology employs three polysilicon layers; the first polysilicon is the floating gate (FG). The second polysilicon is the control gate while the third polysilicon is the erase gate (EG)/select gate (SG).

Similar to the well-known stack-gate non-volatile memory components (for example, ETOX), a floating gate (FG) is set in the bit-line direction at first, and then a control gate (CG) is formed and use it as a mask for etching floating gate (FG). The spacer between the erase gate (EG) and the select gate is formed by etching the third polysilicon, and the erase gate (EG) and the select gate (SG WL) are formed at the same time. The manufacture process integration of the transistor oxide layer of the select gate (EG) and the select gate (SG WL) needs to be dealt with carefully because there are gate dielectric layers for different purposes.

Unfortunately, it is hard to achieve the above mentioned requirements in the existed methods of the split-gate structure formation. The insulation dielectric layer between the floating gate (FG) and the select gate (SC) need to be integrated in the composition of the insulation tunneling oxide layer, and it will caused that the process become complex and inflexible. The process of the existed tri-polysilicon spilt gate need to employ etching process and the oxide layer growth of the rough polysilicon surface of the floating gate (FG), which forms the erase node. If the polysilicon surface and the tunneling oxide layer do not be dealt with well in the process, an unexpected reliability issue of the tunneling oxide layer will be induced by the uneven micro structure of the floating gate (FG) surface.

SUMMARY

To solve the above issues, this disclosure discloses a non-volatile memory component and manufacture method of the same, especially about employing an erase gate (EG) and a select gate (SG) to form a damascene trench for manufacturing a floating gate (FG).

Another purpose of this disclosure is that to provide a non-volatile memory component and method about forming a spacer on the select gate (SG) to achieve robust insulation performance between floating gate (FG) and select gate (SG).

To achieve the above purposes, this disclosure discloses a method of manufacturing non-volatile memory. The method comprises the following steps:

(1) providing a substrate;
(2) forming a base dielectric layer on the substrate;
(3) forming a first polysilicon layer on the base dielectric layer;
(4) defining a first pattern opening and a second pattern opening on the base dielectric layer and the first polysilicon layer;
(5) forming a liner dielectric layer on the first polysilicon layer and the base dielectric layer;
(6) forming a sacrificial layer filled in the horizontal intervals between the first polysilicon layer and the liner dielectric layer;
(7) removing the first polysilicon layer within the first pattern opening;
(8) performing ion implantation within the first pattern opening;
(9) forming a first capping dielectric layer by oxidizing the first polysilicon layer and the base dielectric layer;
(10) forming a second polysilicon layer filled in the interval on the base dielectric layer within the first pattern opening;
(11) forming a second capping dielectric layer within the first pattern opening on the second polysilicon layer;
(12) forming a damascene trench with an interval formed by two damascene structures on the substrate, wherein, one of the damascene structures is a stack made of the first capping dielectric layer, the first polysilicon layer and the base dielectric layer, and the other damascene structure is a stack made of the second capping dielectric layer, the second polysilicon layer and the base dielectric layer;
(13) forming a third capping dielectric layer covering the two damascene structures and the damascene trench;
(14) forming a third polysilicon layer, which is filled in the damascene trench covered by the third capping dielectric layer;
(15) forming a coupling dielectric layer on the third capping dielectric layer;
(16) selectively forming a fourth polysilicon layer on the coupling dielectric layer; and
(17) defining a third pattern opening to perform ion implantation.

In one embodiment of this disclosure, an insulation spacer is formed on the two sides of the first polysilicon layer within the first pattern opening, and the spacer is electrical isolation.

In one embodiment of this disclosure, removing the liner dielectric layer on the surface of the first polysilicon layer in the depth direction to make the first polysilicon layer and the liner dielectric layer have the same thickness in the depth direction and do not overlap in the horizontal direction.

In one embodiment of this disclosure, the first polysilicon layer on the second pattern opening is oxidized, and the base dielectric layer within the first pattern opening is thickened by oxidizing.

In one embodiment of this disclosure, the second polysilicon layer gate filled in the first pattern opening on the base dielectric layer is an erase gate (EG).

In one embodiment of this disclosure, the sacrificial layer outside the first pattern opening and the second pattern opening is removed. Wherein, the sacrificial layer formed on the liner dielectric layer in the horizontal direction is removed by employing the first capping dielectric layer on the first polysilicon layer, the second capping dielectric layer on the second polysilicon and the liner dielectric layer as a mask.

In one embodiment of this disclosure, removing the liner dielectric layer outside the first pattern opening and the second pattern opening and removing the base dielectric layer under the liner dielectric layer by defining a photoresist on the first pattern opening and the second pattern opening as a mask.

In one embodiment of this disclosure, the step of forming the third capping dielectric layer comprises the electron tunneling dielectric layer formed by chemical deposition dielectric layer (high-temperature CVD oxide) or thermal oxide layer.

In one embodiment of this disclosure, the third polysilicon layer between the first pattern opening and the second pattern opening is a floating gate (FG), and the third polysilicon layer is formed outside the first pattern opening and the second pattern opening.

In one embodiment of this disclosure, a portion of the third polysilicon layer is removed. The third polysilicon layer nearby the first polysilicon layer and faraway from the second polysilicon layer is removed by defining a photoresist as a mask with lithography.

In one embodiment of this disclosure, a first dielectric layer comprising the third capping dielectric layer on the substrate and the base dielectric layer under the damascene trench is defined.

In one embodiment of this disclosure, a second dielectric layer comprising the third capping dielectric layer on the upper surface and the sidewall is defined. The erase gate (EG) and the select gate (SG) are wrapped in the second dielectric layer.

This disclosure discloses a non-volatile memory component, which comprises a substrate, a first dielectric layer, a second dielectric layer and a coupling dielectric layer. A source region and a drain region are formed nearby the surface of the substrate, and there is a channel region between the source region and the drain region. The first dielectric layer is formed on the substrate, and an erase gate (EG), a select gate (SG) and a floating gate (FG) are formed on the first dielectric layer. The erase gate (EG) is located above the source region while the select gate and the floating gate are located at the upper projection area of the channel region in the depth direction. The second dielectric layer is formed on the first dielectric layer and wraps the erase gate (EG) and the select gate (SG) in, and the floating gate (FG) is located between the adjacent second dielectric layers. The coupling dielectric layer covers on the second dielectric layer and the floating gate (FG) unevenly and continuously.

The coupling gate (CG) is formed on the coupling dielectric layer. The first dielectric layer within the first pattern opening includes a first thickness, and the first dielectric layer includes a second thickness under the projection region of the floating gate (FG) in the depth direction. The first dielectric layer includes a third thickness under the projection area of the select gate (SG) in the depth direction. The first thickness is thicker than the second thickness, and the second thickness thicker than the third thickness.

In one embodiment of this disclosure, a first capping dielectric layer is formed between the second dielectric layer and the select gate (SG) while a second capping dielectric layer is formed between the second dielectric layer and the erase gate (EG). The first capping dielectric layer includes a first capping thickness and the second capping dielectric layer have a second capping thickness. Wherein, the first capping thickness is thicker than the second capping thickness.

In one embodiment of this disclosure, the component comprises a bit-line contact formed on the drain region. The bit-line contact pass through the first dielectric layer and the coupling dielectric layer, and the bit-line contact is far away from the substrate in the depth direction for external connection.

In one embodiment of this disclosure, the second dielectric layer is located on the two sides of the erase gate (EG) and the select gate (SG). The second dielectric layer is formed toward the direction away from the center of the erase gate (EG) and the select gate (SG) individually.

In one embodiment of this disclosure, the coupling dielectric layer is located in the upper projection area of the erase gate (EG), the floating gate (FG) and the select gate (SG) unevenly and continuously, and the coupling dielectric layer formed on the floating gate (FG) is nearby the first dielectric layer in the depth direction.

In one embodiment of this disclosure, the first dielectric layer includes a second pattern opening, and the second pattern opening is used to define the select gate (SG) in the depth direction.

In one embodiment of this disclosure, the first dielectric layer includes a third pattern opening, and the third pattern opening is used to define the drain region in the depth direction.

In one embodiment of this disclosure, the select gate includes a spacer formed on the two sides of the select gate (SG) within the second pattern opening, and the spacer is electrical isolation.

The features, implementation and effect of this disclosure will be described in more detail in the following section.

BRIEF DESCRIPTION OF THE DRAWINGS

This disclosure will become more fully understood from the detailed description given herein below for illustration only, and thus not imitative of this disclosure, wherein.

DETAILED DESCRIPTION

About the semiconductor manufacturing process technology, such as oxidation, photolithography, deposition, etching, cleaning, diffusion, ion implantation, chemical vapor deposition and physical vapor deposition, if a process do not lead any addition technical feature in this disclosure, it will not be interpreted in this section.

This disclosure discloses a four-layer-polysilicon split-gate non-volatile memory component structure and manufacture method of the same, and the features are polysilicon to polysilicon and polysilicon to source junction erasure with a scale-down dimension and reliability.

Compared with the traditional three-layer-polysilicon split-gate, a local electric field between the erase gate (EG) 21 stack and the select gate (SG) 22 stack is enhanced by operating the two side of a floating gate (FG) 23 and a control gate (CG), and the erasure efficiency under the small voltage is decided by the reliability of the erase tunneling oxide layer. However, this technology includes the disadvantage that portion reliability need to be sacrificed when erasing quickly. The four-layer-polysilicon split-gate disclosed in this disclosure employs an erase gate (EG), an select gate (SG) and the upper dielectric layer (which could be silicon nitride, silicon oxide and the combination of them) to form a robust damascene structure to manufacture floating gate (FG) 23.

Figure 1A:
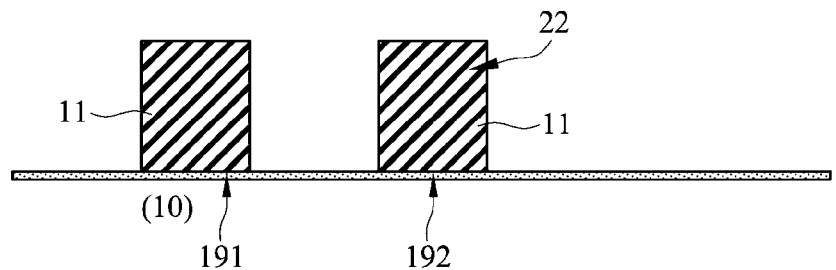
FIG. 1A to FIG. 1Q is a series of process diagram for manufacturing the non-volatile memory component disclosed in this disclosure.

In the first embodiment of this disclosure, a method of manufacturing non-volatile memory components (S1), which is a kind of four-layer-polysilicon split-gate non-volatile memory components 2, is disclosed. Referring to FIG. 1A, first, step 101 is providing a substrate 10. For example, the substrate is p-type or n-type silicon substrate, and semiconductor components are manufactured by stacking several different layers on a substrate 10. Step 102 is forming a base dielectric layer 101 on the substrate 10.

In one embodiment, the base dielectric layer is silicon oxide, which is formed by dealing with a silicon substrate with thermal oxidization under high temperature, and the thickness of the silicon oxide is between 10 Å~150 Å. The base dielectric layer also can be high-K dielectric materials, such as SiON, $HfO_2$ or $Ta_2O_5$, and the equivalent oxide layer thickness (EOT) is less than 20 Å.

The step S103 is forming a first polysilicon layer 11 on the base dielectric layer 101 and defining a first pattern opening 191 and a second pattern opening 192 by defining pattern on a photoresist with lithography. The step S104 is etching and removing the first polysilicon 11 outside the first pattern opening 191 and the second pattern opening 192, and thus a discontinuous interval structure of the first polysilicon 11 is formed on the base dielectric layer 101 in the horizontal direction. Wherein, a select gate (SG) 22 is formed by the first polysilicon layer located on the base dielectric layer 101 within the second pattern opening 192.

The pattern opening is formed by patterning a photoresist or a mask. A photoresist is patterned by lithography, or a mask is patterned by lithography and etching process. Thus this area do not exist any photoresist or mask, but the photoresist or mask exist outside this area. The openings are formed on the whole photoresist layer or mask layer.

Figure 1B:
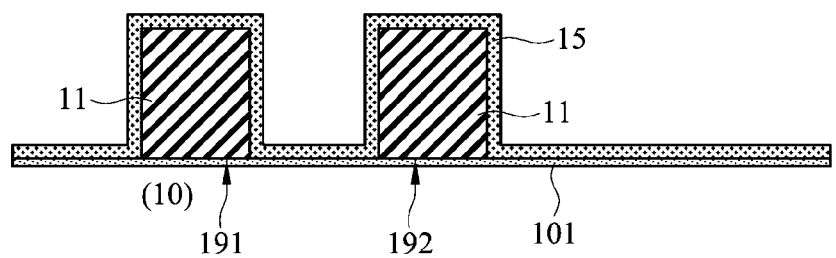

Referring to FIG. 1B, the step S105 is forming a liner dielectric layer 15 on the first polysilicon layer and the base dielectric layer 101. For example, an uneven continuous liner dielectric layer 15 covering on the surface of the stack made of base dielectric layer 101, the first polysilicon layer 11 and the base dielectric layer 101 is formed by chemical vapor deposition (CVD) in the horizontal direction.

Figure 1C:
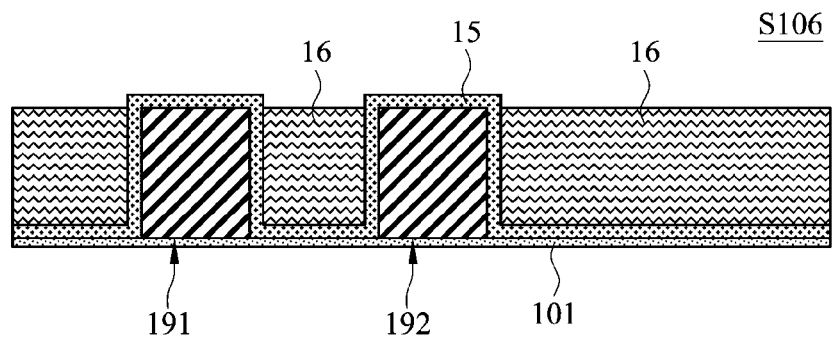

Referring to FIG. 1C, the step S106 is forming a sacrificial layer 16. In the horizontal direction, the discontinuous sacrificial layer 16 is formed outside the first pattern opening 191 and the second pattern opening 192 on the first polysilicon layer 11 by filling the sacrificial layer in the intervals between the first polysilicon layer 11 and the liner dielectric layer 15.

In one embodiment, the thickness of the sacrificial layer 16 is 200 Å~1500 Å, and a preferred thickness is 700 Å. The sacrificial layer 16 can be a single layer of silicon nitride (SiN) or silicon oxide nitride (SiON). Also, the sacrificial layer 16 can be a multi-layer stack of dielectric layers such as Oxide-Nitride-Oxide (ONO) or Oxide-Nitride-Oxide-Nitride (ONON).

Figure 1D:
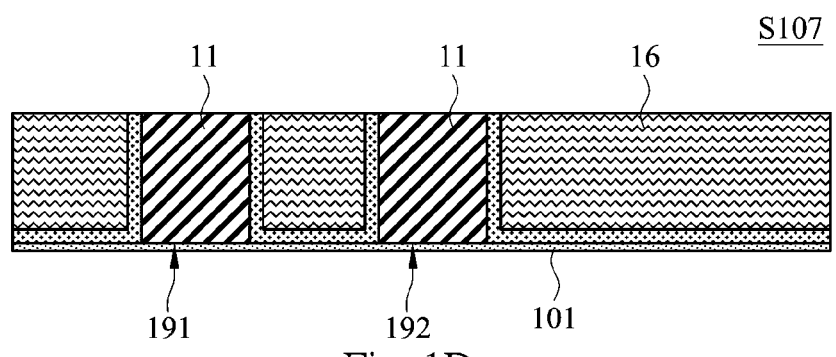

Referring to FIG. 1D, the step S107 is removing the liner dielectric layer 15 on the surface of the first polysilicon layer 11 in the depth direction to make the first polysilicon layer 11 and the liner dielectric layer 15 have the same thickness and do not overlap in the horizontal direction. To achieve the above result, a patterned photoresist layer is defined as a mask with lithography, and then the liner dielectric layer 15 covering on the first polysilicon layer 11 outside the sacrificial layer 16 in the horizontal direction is removed. Further, the sacrificial layer 16, the first polysilicon layer 11 and the liner dielectric layer 15 do not overlap with each other in the horizontal direction. For example, the dielectric liner 15 in this region can be removed by dry or wet etching, but the other layers do not be affected under the etching processing.

Figure 1E:
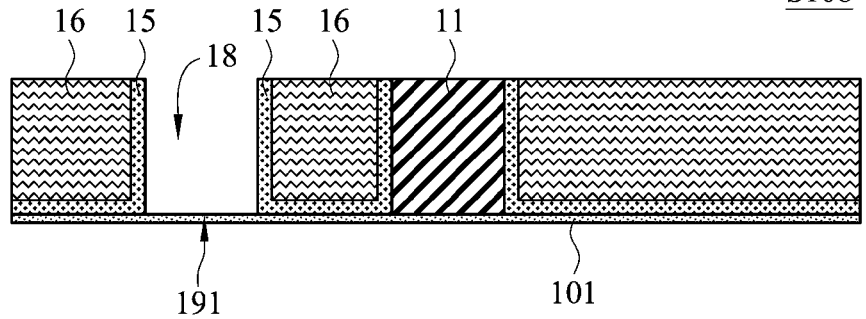

Referring to FIG. 1E, S108 is defining the region outside the first pattern opening 191 as mask with lithography and removing the first polysilicon layer 11 within the first pattern opening 191 to form a groove 18. Wherein, in the upper projection area of the first pattern opening 191, the groove 18 is formed between the two adjacent stacks made of the liner dielectric layer 15 and the base dielectric layer 101.

Figure 1F:
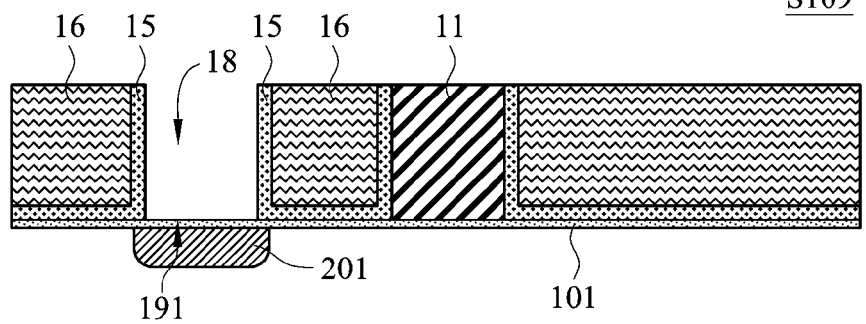

Referring to FIG. 1F, step S109 is performing ion implantation. The ion implantation is performed into the substrate 10 under the first pattern opening to form a source region 201 nearby the surface of the substrate 10. For example, an n-type source region 201 can be formed on a p-type silicon substrate by ion implantation.

Figure 1G:
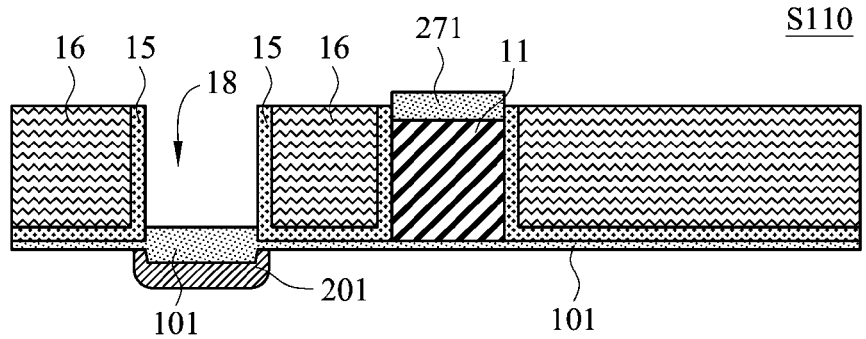

Referring to FIG. 1G the step S110 is forming a first capping dielectric layer 271 and oxidizing the first polysilicon layer 11 and the base dielectric layer 101 at the same time. Due to in the step S108, which is removing the first polysilicon layer 11 within the first pattern opening 191, the liner dielectric layer 15 forms a groove 18 within the first pattern opening. The first capping dielectric layer 271 is formed by oxidizing the first polysilicon layer 11 within the second pattern opening 192 while the base dielectric layer 101 within the first pattern opening 191 is thickened by oxidization. For example, the first polysilicon layer 11 is dealt with thermal oxidation, and then the first capping dielectric layer 271 is etched to the desired thickness. The thickened liner dielectric layer 15 within the first pattern opening 191 do not form any stack on the first pattern opening 191.

Figure 1H:
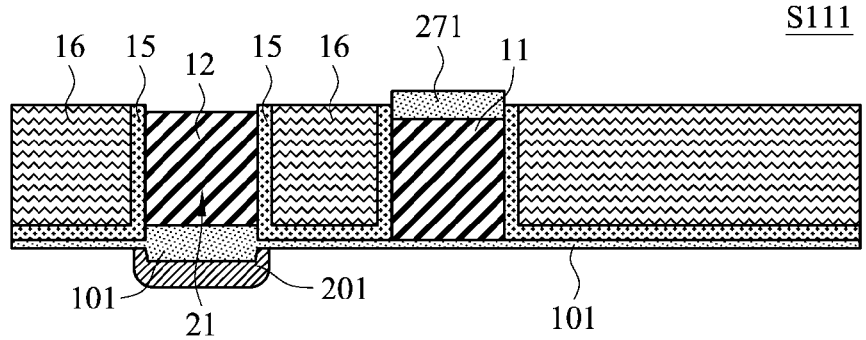

Referring to FIG. 1H, the step S111 is forming a second polysilicon layer 12, which is filled in the groove 18 within the first pattern opening 191 on the base dielectric layer 101. The second polysilicon layer 12 is deposited on the thickened liner dielectric layer 15 within the first pattern opening 191 in the horizontal direction. For example, after chemical vapor depositing polysilicon, the second polysilicon layer 12 is etched to get the desired thickness. Wherein, the second polysilicon layer 12 forms an erase gate (EG) 21 on the base dielectric layer 101.

Referring to FIG. 1I, the step S112 is forming a second capping dielectric layer 272 on the polysilicon layer 12 within the first pattern opening 191 by defining a photoresist as a mask outside the first pattern opening 191 with lithography. For example, the second capping dielectric layer 272 is formed by dealing with the second polysilicon layer 12 with thermal oxidation, or the second capping dielectric layer 272 deposits on the second polysilicon layer with chemical vapor deposition. The second capping dielectric layer 272 is etched to get the desired thickness. Significantly, the first capping dielectric layer 271 on the first polysilicon layer 11 includes a first capping thickness 2710 after being deposited and etched while the second capping dielectric layer 272 on the second polysilicon layer 12 includes a second capping thickness 2720 after being deposited and etched. One of the features of the non-volatile memory component manufacture method (S1) disclosed in this disclosure is that the first capping thickness 2710 is thicker than the second capping thickness 2720.

Referring to FIG. 1J, the step S113 is defining a photoresist as a mask to remove the sacrificial layer 16 on the liner dielectric layer 15 outside the mask region in the horizontal direction with lithography. The photoresist layer is located at the first capping dielectric layer 271 on the first polysilicon layer 11, the second capping dielectric layer 272 on the second polysilicon layer 12 and the liner dielectric layer 15. Significantly, there is no sacrificial layer 16 on the substrate 10 after removing the sacrificial layer 16.

Referring to FIG. 1K, the step S114 is forming a damascene trench 17 on the substrate 10 by the intervals of two damascene structures 271/272. Wherein, one of the damascene structures is a stack made of the first capping dielectric layer 271, the first polysilicon layer 11 and the base dielectric layer 101 while the other damascene structure is a stack made of the second capping dielectric layer 272, the second polysilicon layer 12 and the base dielectric layer 101. In other words, the damascene structures 171/172 and the damascene trench 17 connect with each other but without overlapping in the horizontal direction. A damascene trench 17 is formed by defining a photoresist on the first patterning opening 191 and the second pattern opening 192 as a mask to remove the liner dielectric layer 15 outside the mask region and the base dielectric layer 101 under the liner dielectric layer 15 to form a damascene trench 17.

The damascene trench 17 is formed outside the region of the damascene structure 172 within the first pattern opening 191 and the damascene structure 171 within the second pattern opening 192 in the horizontal direction. In the damascene technology, a dielectric layer of silicon oxide ($SiO_2$) or silicon nitride ($Si_3N_4$) is usually formed on the top layer of the structure to work as a hard mask. Thus, the structure under the hard mask can be protected against the damage under the manufacturing process, such as removing a photoresist by etching. Further, alignment errors can be reduced in the structure integrating process of portion structure by employing etch-stop layer or hard mask design.

Referring to FIG. 1L, the step S115 is forming a third capping dielectric layer 273 on the intervals of damascene trench 17 after step S114 which is forming damascene trench 17 intervals between two damascene structure stacks 171/172 on the substrate 10. The third capping dielectric layer, which covers the two damascene structures 171/172 and the substrate 10, is uneven and continuous. Wherein, the damascene structure 171 is a stack comprising the first polysilicon layer 11 and the first capping dielectric layer 271 while the damascene structure 172 is a stack comprising the second polysilicon layer 12 and the second capping dielectric layer 272. Therefore, the damascene trench 17 covered by the third capping dielectric layer 273 forms the intervals in the horizontal direction. For example, the third capping dielectric layer 273 is deposited by chemical vapor deposition (CVD). Importantly, the uneven third capping dielectric 273 layer is formed on the substrate 10 continuously. The third capping dielectric layer 273 is formed on the substrate 10 and the upper surface and the sidewall of the damascene trench 17.

To interpret more clearly, a continuous first dielectric layer 25 and a discontinuous second dielectric layer 26 need to be defined. The continuous first dielectric layer 25 on the substrate 10 comprises the third capping dielectric layer 273 on the substrate 10 and the base dielectric layer 101 under the damascene trench 17. Therefore, a transistor dielectric layer 292, which is the base dielectric layer 101 under the damascene structure 171, is defined on the first dielectric layer 25 within the first opening 192. The discontinuous second dielectric layer 26 on the damascene trench 17 comprises the third capping dielectric layer 273 on the upper surface and sidewall of the damascene trench 17.

In one embodiment, the third capping dielectric layer 273 could be any of the dielectric layers for electron tunneling, which comprises chemical deposition dielectric layer (such as high-temperature CVD oxide) or thermal oxide layer.

Figure 1M:
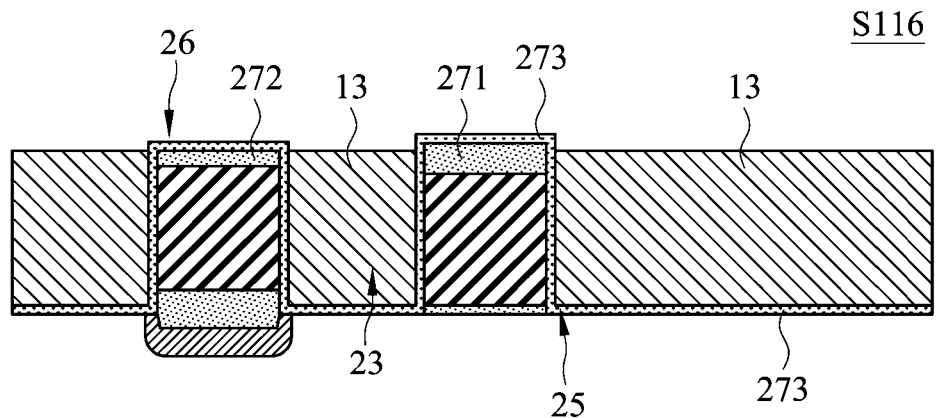

Referring to FIG. 1M, the step S116 is forming a third polysilicon layer 13, which is filled in the damascene trench 17 on the first dielectric layer in the horizontal direction, by defining a photoresist as a mask in the interval region of the damascene trench 17 covered by the third capping dielectric layer 273 with lithography. For example, the third polysilicon layer 13 is etched to the desired thickness after depositing polysilicon by chemical vapor deposition. Wherein, a floating gate (FG) 23, which is the third polysilicon layer 13 between the first pattern opening 191 and the second patterning opening 192, is formed on the first dielectric layer 25. In other words, the damascene trench 17 between the erase gate (EG) 21 and the select gate (SG) 23 is floating gate (FG).

Figure 1N:
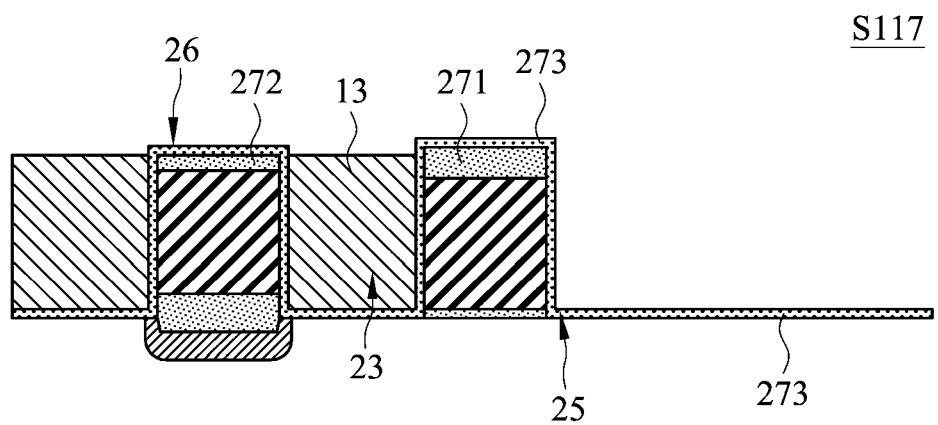

Referring to FIG. 1N, the step S117 is defining a third pattern opening 193 on the base dielectric layer 101 and removing the third polysilicon layer 13 within the third pattern opening 193 with lithography by defining a photoresist outside the region of the third pattern opening 193 as a mask. In other words, the removed portion of the third polysilicon layer 13 is the third polysilicon layer 13 nearby the first polysilicon layer 11 and far away from the second polysilicon layer 12. For example, the portion of the third polysilicon layer 13 is removed by reactive ion etching or wet etching, and the other layers will not be affect under the etching process.

In one embodiment, in the step S117, which is removing the third polysilicon layer in the integrated component matrix, a floating gate (FG) 23 is formed and is located on the upper independent area of the floating gate dielectric layer 293 by removing the third polysilicon layer 13 amount different components BL-BL (bit-line-bit-line) in the matrix.

Figure 1O:
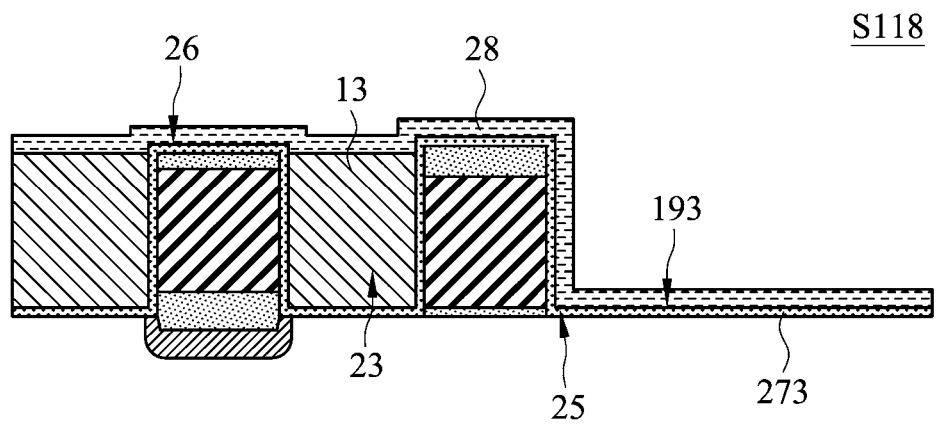

Referring to FIG. 1O, the step S118 is forming a coupling dielectric layer 28 on the third polysilicon layer 13 and the third capping dielectric layer 273, which is the second dielectric layer 26. The coupling dielectric layer 28 is uneven and continuous. The coupling dielectric layer 28 covers the erase gate (EG) 21, which is a stack of the second dielectric layer 26 and the second capping dielectric layer 272, the floating gate (FG), which is stacked under the second dielectric layer 26, and the select gate (SG) 22, which is a stack of the second dielectric layer 26 and the first capping dielectric layer 271, and the coupling dielectric layer 28 stacks on the first dielectric layer 25 directly. For example, depositing oxide-nitride-oxide ONO) by chemical vapor deposition or high-K dielectrics material.

Figure 1P:
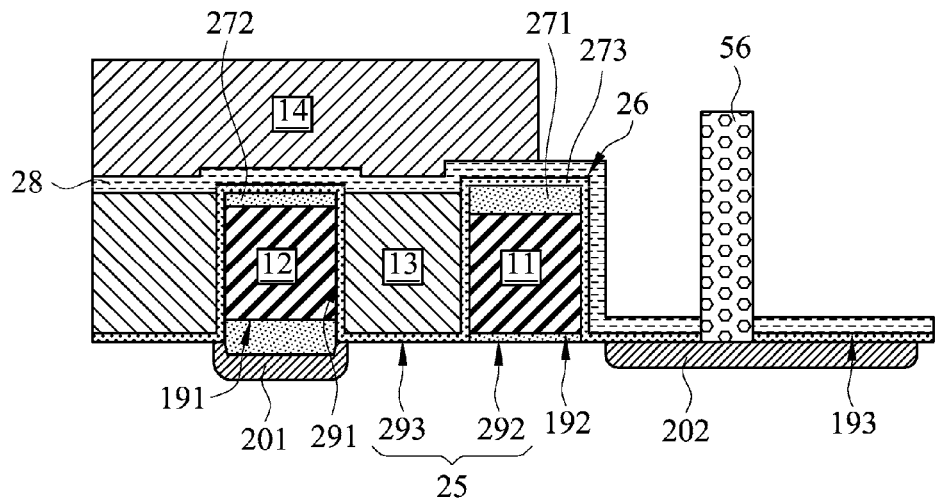
Figure 1Q:
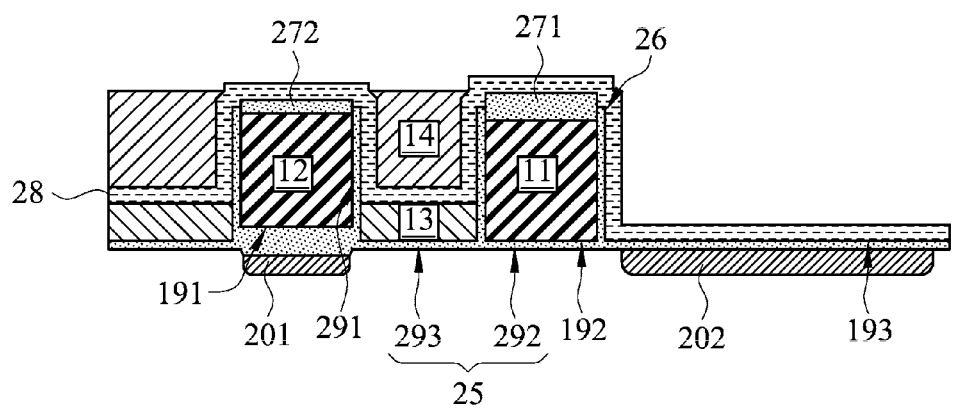

Referring to FIG. 1P, the step S119 is selectively forming a fourth polysilicon layer 14 on the coupling dielectric layer 28. A coupling control gate of quad-polysilicon is formed by depositing the fourth polysilicon layer 14, which is deposited by employing a patterned photoresist as a mask with lithography. The fourth polysilicon layer 14 covers on a portion of the coupling dielectric layer 28. Finally, referring to FIG. 1Q, the step S120 is forming a drain region 202 by performing ion implantation into the surface of the substrate 10 outside the mask. The mask is the region outside a third pattern opening 193, which is defined on a photoresist with lithography. A drain region 202 is formed by performing ion implantation into the substrate 10 within the third pattern opening 193 in the depth direction of the stack of the first dielectric layer 25 and the coupling dielectric layer 28. In other words, only the first dielectric layer 25 and the coupling dielectric layer 28 are on the drain region 202, and a channel region 203 is formed between the source region 201 and the drain region 202.

Moreover, a bit-line contact 56 is formed on the drain region 202. The bit-line contact 56 passes through the stack of the first dielectric layer 25 and the coupling dielectric layer 28 in the depth direction, and it is far away from the substrate 10 for external connection. A non-volatile memory component 2 can be accomplished by following the steps of the method (S1) of manufacturing a non-volatile memory in order.

Additionally, the non-volatile memory component 2 is a four-layer-polysilicon split-gate. A select gate (SG) 22 of the first polysilicon is formed by depositing the first polysilicon layer 12 in the step S104, and an erase gate (EG) 21 of the second polysilicon is formed by depositing the second polysilicon layer in the step S111. A floating gate (FG) 23 of the third polysilicon is formed by depositing the third polysilicon layer in the step S116; and a coupling control gate (CG) 24 of quad-polysilicon is formed by depositing the fourth polysilicon layer 14 in the step S119.

In one embodiment, the first dielectric layer 25 of the erase gate (EG) and the first pattern opening 191 includes a first thickness 2501, which is between 300 Å to 600 Å, in the depth direction. The first dielectric layer 25 of the floating gate (FG) includes a second thickness 2502 in the depth direction. The second thickness 2502 is between 70 Å to 150 Å, and the preferred thickness is 100 Å. The first dielectric layer 25, which is the transistor dielectric layer 292, of the select gate (SG) 22 and the third pattern opening 193 includes a third thickness 2503, which is between 10 Å to 150 Å, in the depth direction. Besides the processes described above, there are other processes, comprising annealing and defeat treatment.

Figure 3A:
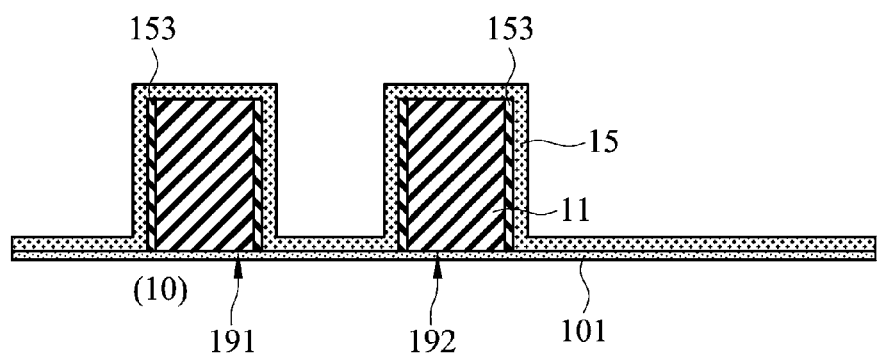
FIG. 3A to FIG. 3B is a structure diagram of the non-volatile memory component disclosed in this disclosure with a spacer.

In the second embodiment, a method (S2) of manufacturing non-volatile memory is disclosed in this disclosure. The difference between method S1 and method S2 is that the method S2 comprises an insulation spacer 261. The ON or NON spacer 261 is formed on the sidewall of the select gate (SG) 22 to achieve robust insulation between the floating gate (FG) 23 and the select gate (SG) 22. Referring to FIG. 3A, the step S204 is forming the spacer 261 on the two sides of the first polysilicon layer 11 within the second pattern opening 192 after the step 104, which is forming a first polysilicon layer 11 on the base dielectric layer 101. After that, the method S2 is accomplished by following the step S105 to the Step 120 of the first embodiment in order.

A non-volatile memory component 2 of the split-gate manufactured by this disclosure includes the features that hot electron injection programmed writing process under low power, polysilicon to polysilicon tunneling erasure with high reliability and logic-compatible read-in under low voltage. The writing process of the programmed voltage and current can be control precisely by reading the select gate (SG, WL) 22 quickly under low voltage.

Most importantly, scaling down dimension with top logic compatibility and allowing high voltage output by integrating the transistor oxide layer of the independent select gate (SG, WL) 22 can be reached easily by reading voltage. The similar damascene manufacture process of the non-volatile memory components 2 described above can be applied to traditional planarization component structure and advanced non-planarization components similar to FINFET, and there is no noticeable difficulty to further scale down the dimension.

Figure 2A:
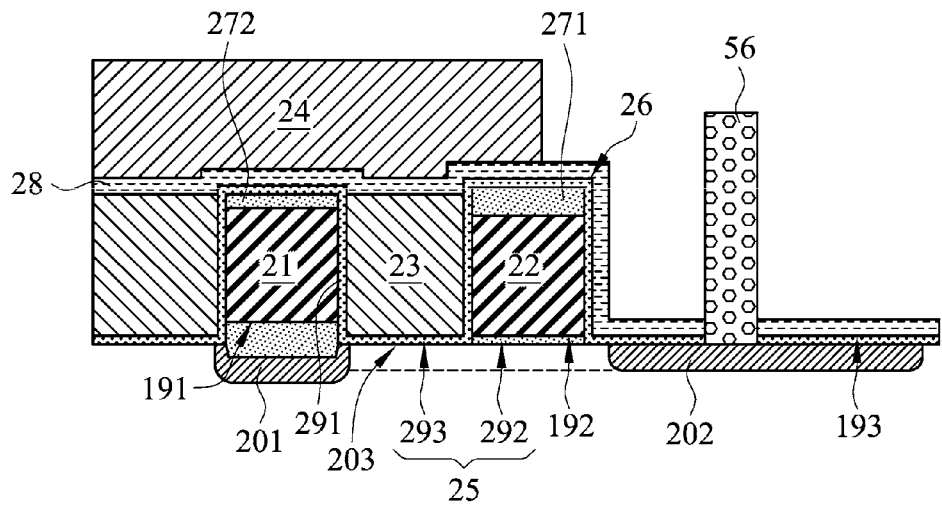
FIG. 2A to FIG. 2B is a structure diagram of the non-volatile memory component disclosed in this disclosure.

In the third embodiment, referring to FIG. 2A, a kind of non-volatile memory component 2 is disclosed in this disclosure, and it is a quad-polysilicon spilt-gate component. The non-volatile memory component 2 comprises a substrate 10. A source region 201 and a drain region 202 are formed nearby the surface of the substrate 10, and there is a channel region 203 between the source region 201 and the drain region 202. A first dielectric layer 25 is formed on the substrate 10, and the first dielectric layer 25 includes a first pattern opening 191. The first pattern opening 191 can be used to define the source region 201 in the depth direction.

In one embodiment, the first dielectric layer 25 comprises a first pattern opening 191, a second pattern opening 192 and a third pattern opening 193. Wherein, the first pattern opening 191 can be used to define the source region 201 in the depth direction. The second pattern opening 192 can be used to define the select gate 22 in the depth direction. The third pattern opening 193 can be used to define the drain region 202 in the depth direction.

An erase gate (EG) 21 is formed on the first dielectric layer 25, and the erase gate (EG) 21 is located in the upper projection area of the first pattern opening 191 in the depth direction. In the process of forming a second polysilicon layer 12, the second polysilicon layer comprises the erase gate (EG) 21 formed on the first dielectric layer within the first pattern opening. Wherein, a third capping dielectric layer 273 is formed on the intervals of the damascene trench 17 in the step S115. The first dielectric layer comprises a base dielectric layer 11 and a third capping dielectric layer 273.

Further, a floating gate (FG) 23 is formed on the first dielectric layer, and the floating gate (FG) 23 is nearby the erase gate (EG) 21. In the step S116, which is forming the third polysilicon layer 13, the third polysilicon layer 13 comprises the damascene trench 17 filled in the intervals of the first dielectric layer 25 in the horizontal direction. Wherein, the third polysilicon layer 13 is located between the erase gate (EG) 21 and the select gate (SG) 22, and a floating gate (FG) 23 is formed by the third polysilicon layer 13 with lithography.

Moreover, a select gate (SG) 22 is formed on the first dielectric layer, and the select gate (SG) 22 is nearby floating gate (FG) 23. The select gate (SG) 22 and the floating gate (FG) 23 are located in the upper projection area of the channel region 203 in the depth direction. In the step S104, which is forming the first polysilicon layer 11, the first polysilicon layer 11 comprises the select gate (SG) 22 formed on the first dielectric layer 25 within the second pattern opening 192.

A second dielectric layer 26 is formed on the first dielectric layer 25 and wraps the erase gate (EG) 21 and the select gate (SG) 22 in. In the horizontal direction, the second dielectric layer 26 is located between the erase gate (EG) 21 and the floating gate (FG) 23, and it is also located between the floating gate (FG) 23 and the select gate (SG) 22. In the depth direction, the second dielectric layer 26 covers the erase gate (EG) 21 and the select gate (SG) 22. In the step S115, which is forming the third capping dielectric layer 273, a second dielectric layer 26 is defined, and it comprises a portion of the third capping dielectric layer 273 on the upper surface and the sidewall of the damascene trench 17. Thus, the second dielectric layer 26 defined on the damascene trench 17 is discontinuous.

Especially, the second dielectric layer 26 wrapping the erase gate (EG) 21 is located on the two sides of the erase gate (EG) and formed far away from the center of the erase gate (EG) in the horizontal direction. In other words, the width of the second dielectric layer 26 wrapping the erase gate (EG) 21 is wider than the width of the first pattern opening 191. Similarly, the width of the second dielectric layer 26 wrapping the select gate (SG) 22 is wider than the width of the second pattern opening 192 in the horizontal direction.

A coupling dielectric layer 28 is formed on the second dielectric layer 26 and the erase gate (EG) 21. In the step S118, the coupling dielectric layer 28 is deposited, and the coupling dielectric layer 28 is on the top of the stack by covering the above mentioned layers. Referring to FIG. 10, the coupling dielectric layer 28, which covers these second dielectric layers 26 and floating gate (FG) 23, is uneven and continuous. Further, referring to FIG. 2B, the first dielectric layer 25 is closer to the coupling dielectric layer 28 on the floating gate (FG) 23 than the erase gate (EG) 21 and the select gate (SG) 22 in the depth direction. The coupling dielectric layer 28 is located at the upper projection area of the third pattern opening 193 and covers the first dielectric layer 25. The coupling dielectric layer 28 is nearby one side of the select gate (SG) 22 on the third pattern opening 193, and it covers the second dielectric layer 26.

Finally, a coupling control gate (CG) 24 is formed on the coupling dielectric layer 28. The first dielectric layer 25 within the first pattern opening 191 in this disclosure includes a first thickness 2501, and the first dielectric layer located at the projection area under the floating gate (FG) 23 includes a second thickness 2502 in the depth direction. The first dielectric layer 25 located in the projection area under the select gate (SG) 22 includes a third thickness 2503 in the depth direction. Wherein, the first thickness is thicker than the second thickness 2502, and the second thickness 2502 is thicker than the third thickness 2503.

The second dielectric layer 26 located between the erase gate (EG) 21 and the floating gate (FG) 23 is the tunneling dielectric layer 291 of the erase gate (EG) 21. The first dielectric layer 25 located in the projection area under the select gate (SG) 22 is the transistor dielectric layer 292 of the select gate (SG) 22. Besides, the first dielectric layer 25 located in the projection area under the floating gate (FG) 23 is floating gate dielectric layer 293 of the floating gate (FG) 23.

Figure 2B:
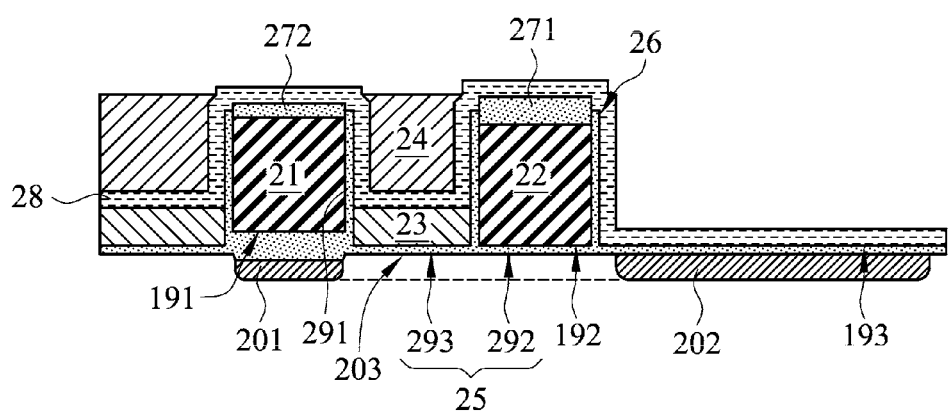

In one embodiment, referring to FIG. 2B, a non-volatile memory component 3 is disclosed. There is no bit-line contact 56, and the thickness of the floating gate (23) is thinner than the thickness of the select gate (22) in the depth direction.

Figure 3B:
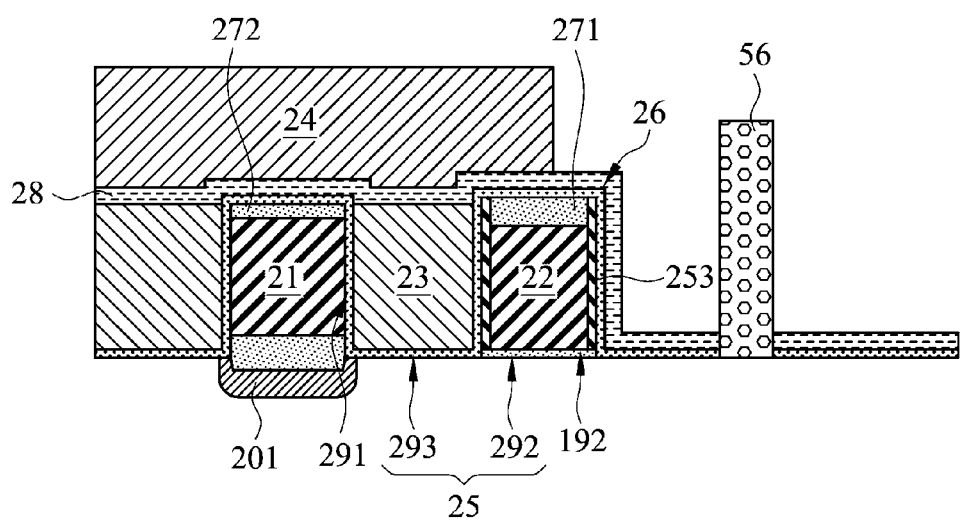

In one embodiment, referring to FIG. 3B, a spacer 253 is formed on the two sides of the select gate (SG), which is on the second pattern opening 192, to accomplish a non-volatile memory component 4 with spacer 253 according to the non-volatile memory component manufacturing method (S2).

In one embodiment, in an integrated component matrix, a non-volatile memory component matrix 5 is composed of the non-volatile component 2, 3 and 4. The third polysilicon layer 13 amount different components BL-BL (bit-line-bit-line) in the matrix is removed to form the floating gate (FG) 23 located in the independent area on the floating gate dielectric layer 293.

This disclosure discloses a kind of non-volatile memory component of four-layer-polysilicon split-gate 2, 3 and 4. The components can be apply on the select gate (SG) 22 for small current write-in programming control (not the well-known stack gate ETOX write-in programming), and the write-in program is the non-volatile memory component as mentioned above. The non-volatile memory component 2, 3 and 4 can be erased by electron diffusion in erase gate (EG) 21 and/or source region 201.

Figure 4:
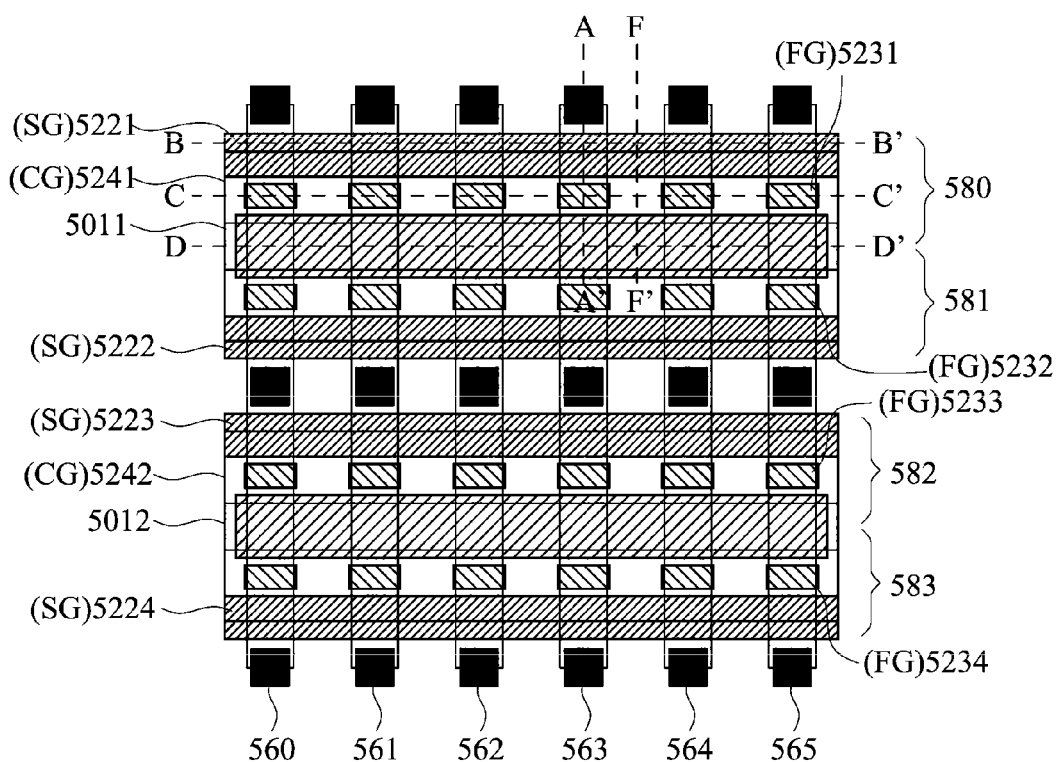
FIG. 4 is a structure diagram of the non-volatile memory component matrix disclosed in this disclosure.
Figure 5A:
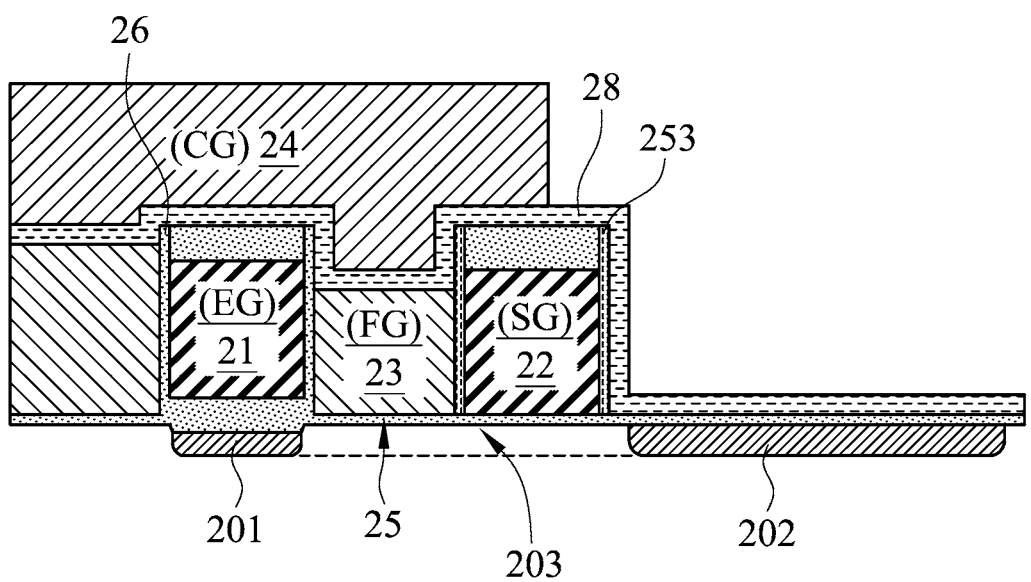
FIG. 5A to FIG. 5E are cross-sectional views of the non-volatile memory device matrix disclosed in this disclosure.
Figure 5B:
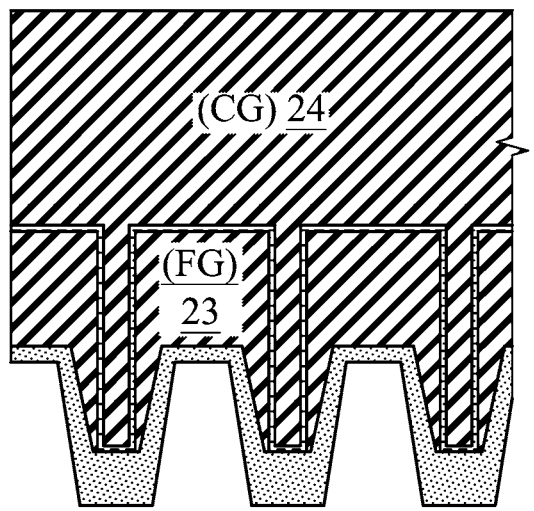
Figure 5C:
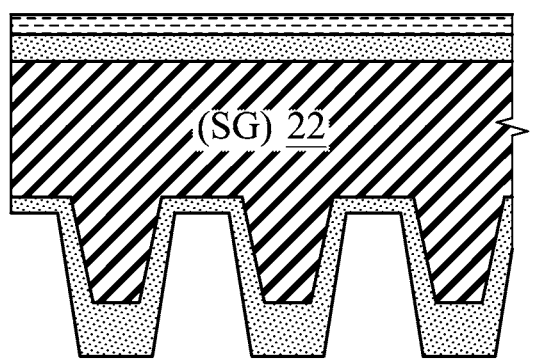
Figure 5D:
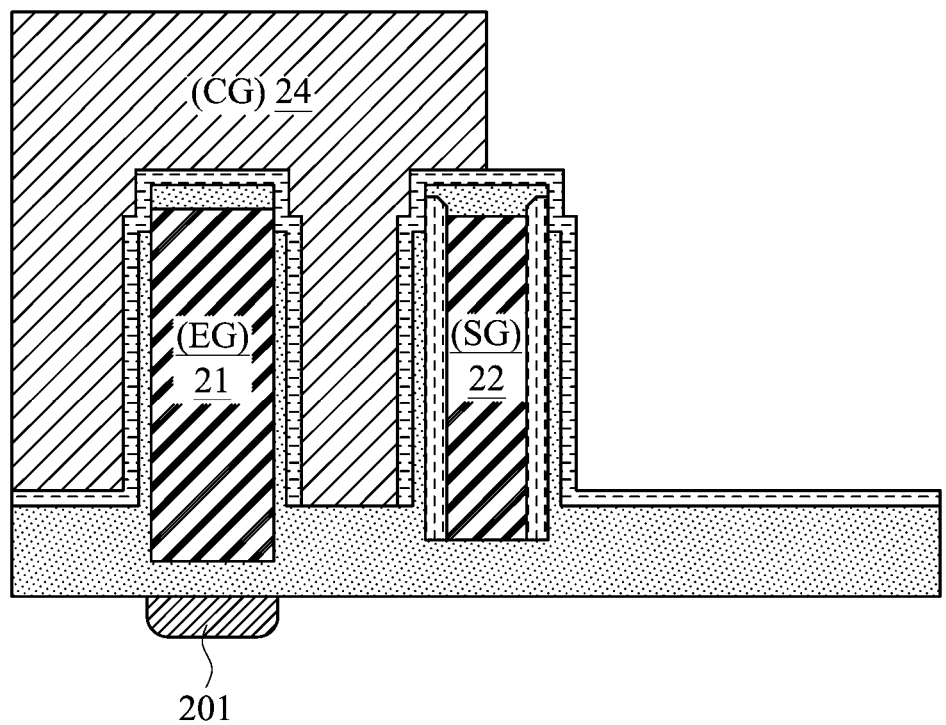
Figure 5E:
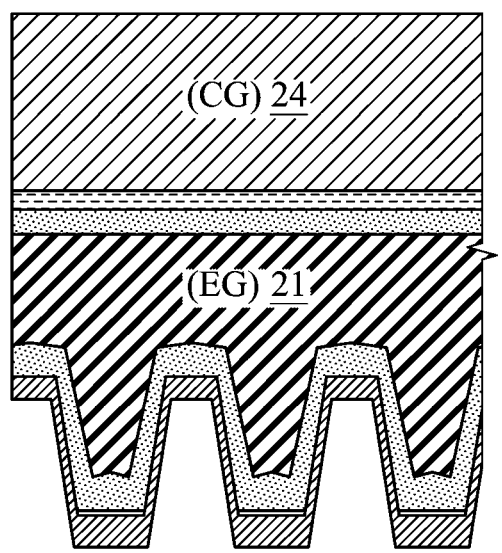

In the period of erasing electron in the floating gate (FG), the tunneling oxide layer trap is the root cause of that the operation cycle window become narrow and withstand voltage decay. Generally, both of high-temperature growth silicon oxide and high-temperature silane ($SiH_4$) reaction by CVD oxide layer manufacture of are good candidates for tunneling dielectric layer. By describing the nitride quantity of silicon nitride and after dealing with silicon oxide with NO or $N_2O$, the trap density of silicon oxide and silicon oxide/silicon can be reduced Referring to FIG. 4, this disclosure discloses a non-volatile memory component matrix 5 composed of non-volatile memory component 2, 3 and 4. FIG. 4 is the top view of the upper surface and only shows portion of the non-volatile memory component matrix 5. Wherein, the non-volatile memory component matrix 5 includes several non-volatile memory components 2, 3 and 4, are arranged as chessboard-shape alone the first direction X and the second direction Y, and the first direction X and the second direction Y are perpendicular. FIG. 5 comprises 24 set non-volatile memory components 2, 3 and 4. 6 set non-volatile memory components 2, 3 and 4 are comprised in each row in the first direction X, and 4 set non-volatile memory components 2, 3 and 4 are comprised in each column in the second direction Y.

The select gates (SG) 22 in each row are connected with electricity conduction, as 5221, 5222, 5223, and 5224 shown in FIG. 4. A source region 201 is shared with each adjacent non-volatile memory component 2, 3 and 4 in each row, and the shared source regions 201 in the same row are connected with each other by electricity conduction alone the first direction X, as 5011 and 5012 shown in FIG. 4.

The drain regions 202 in each column are connected with electricity conduction by passing a metal layer extended through holes of the drain regions 202 in the second direction Y, as bit-line 560, 561 and 562 shown in FIG. 4. The floating gate (FG) 23 of several non-volatile memory components 2, 3 and 4 do not connect with each other and also cannot connect with external devices by electricity conduction. The floating gate (FG) 23 is insulation, so it is used to store the storage status of several non-volatile memory components 2, 3 and 4. For example, the bit-line 580, 581, 582 and 583 of the non-volatile memory components 2, 3 and 4 correspond to their floating gate (FG) 5231, 5232, 5233 and 5234 individually.

In one embodiment, referring to FIG. 5A to FIG. 5E, they are different cross-section diagram of the non-volatile memory component matrix 5 alone different cross-section lines when this disclosure is applied on a fin-shaped transistor (FIN-FET) structure. Wherein, there are matrix units composed of the non-volatile memory component 3 with spacers 253.

Following is the interpretation of the operation method of the non-volatile memory component matrix 5 composed of the non-volatile memory component 2, 3, and 4. This non-volatile memory component matrix 5 structure can process the portion erasure operation of the two adjacent row shared the same source region 201. For example, apply a 6V voltage on the shared source region 5012 and apply a 9V voltage on the shared coupling control gate (CG) 5242 to erase the two non-volatile memory component rows of the bit-line 582, 583.

Thus, electrons will tunnel and inject into the source region 201, and finally, the equivalent polarity of the floating gate (FG) 5233, 5234 of the two rows is positive electricity.

The next step is processing write-in "0" operation, for example, process write-in "0" operation for the bit-line 582 of the non-volatile memory components 2, 3 and 4. A 5~6V voltage is applied on the source region 5012 while a 9V voltage is applied on the coupling control gate (CG) 5242. A 0V voltage is applied on the train region while a ~1V voltage is applied on the select gate (SG). Electrons will tunnel and inject into the floating gate (FG) 5233 from the high electric filed region of the channel by hot electron injection mechanism. Finally, the equivalent polarity the floating gate (FG) 5233 is negative electricity.

The next step is processing read-out operation, for example, process read-out operation for bit-line 582 of the non-volatile memory component 2, 3 and 4. A 0V voltage is applied on the source region 5012 and the coupling control gate (CG) 5242 (or applied a Vcc voltage on the coupling control gate (CG) 5242, the Vcc voltage is a voltage value applied on the memory circuit. For example, Vcc is usually 1.8V under the 0.18 micrometer process). A ~1V voltage is applied on the drain region 202 while a Vcc voltage is applied on the select gate (SG) 5223. The channel region 203 under the select gate (SG) 5223 becomes conductible status.

If the storage status of the bit-line 582 of the non-volatile memory components 2, 3 and 4 is "0", which means the polarity of the floating gate (FG) 5233 is negative electricity, and then the current in the channel is almost 0. On the other hand, if the storage status of the bit-line 582 of the non-volatile memory components 2, 3 and 4 is "1", which means the polarity of the floating gate (FG) 5233 is positive electricity, and then the current in the channel is about 30 μA. Therefore, the storage content in the non-volatile memory components 2, 3 and 4 can be known by detecting the current value of the channel region 203.

What is claimed is:

1. A method for manufacturing a non-volatile memory component, comprising steps of:
   (1) providing a substrate;
   (2) forming a base dielectric layer on the substrate;
   (3) forming a first polysilicon layer on the base dielectric layer;
   (4) defining a first pattern opening and a second pattern opening on the first polysilicon layer and the base dielectric layer;
   (5) forming a liner dielectric layer on the first polysilicon layer and the base dielectric layer;
   (6) forming a sacrificial layer filled in the horizontal intervals between the first polysilicon layer and the liner dielectric layer;
   (7) removing the first polysilicon layer within the first pattern opening;
   (8) performing ion implantation within the first pattern opening;
   (9) forming a first capping dielectric layer by oxidizing the first polysilicon layer and the base dielectric layer;
   (10) forming a second polysilicon layer filled in the interval on the base dielectric layer within the first pattern opening;
   (11) forming a second capping dielectric layer on the second polysilicon layer within the first pattern opening;
   (12) forming a damascene trench with an interval formed by two damascene structures on the substrate; wherein, one of the damascene structures is a stack made of the first capping dielectric layer, the first polysilicon layer and the base dielectric layer; and the other damascene structure is a stack made of the second capping dielectric layer, the second polysilicon layer and the base dielectric layer;
   (13) forming a third capping dielectric layer covering the two damascene structures and the damascene trench;
   (14) forming a third polysilicon layer filled in the damascene trench covered by the third capping dielectric layer;
   (15) forming a coupling dielectric layer on the third capping dielectric layer;
   (16) selectively forming a fourth polysilicon layer on the coupling dielectric layer; and
   (17) defining a third pattern opening to perform ion implantation.

2. The method as claimed in claim 1, wherein, the step (4) comprising:
   (4-1) forming a spacer on the two sides of the first polysilicon layer within the first pattern opening, and the spacer is electrical isolation.

3. The method as claimed in claim 1, wherein, the step (6) includes:
   (6-1) removing the liner dielectric layer on the surface of the first polysilicon layer in the depth direction to make the first polysilicon layer and the liner dielectric layer have the same thickness in the depth direction without overlapping in the horizontal direction.

4. The method as claimed in claim 1, wherein, the step (9) includes oxidizing the first polysilicon layer within the second pattern opening and thickening the base dielectric layer within the first pattern opening by oxidizing.

5. The method as claimed in claim 1, wherein, in the step (10) that the second polysilicon layer filled the second in the first pattern opening on the base dielectric layer is an erase gate.

6. The method as claimed in claim 1, wherein, the step (11) includes:
   (11-1) removing the sacrificial layer outside the region of the first pattern opening and the second pattern opening, and employing the first capping dielectric layer on the first polysilicon layer, the second capping dielectric layer on the second polysilicon and the liner dielectric layer as masks to remove the sacrificial layer formed on the liner dielectric layer in the horizontal direction.

7. The method as claimed in claim 1, wherein, the step (12) includes removing the liner dielectric layer outside the first pattern opening and the second pattern opening, and removing the base dielectric layer under the liner dielectric layer by defining a photoresist on the first pattern opening and the second pattern opening as a mask.

8. The method as claimed in claim 1, wherein, the step (13) includes forming the third capping dielectric layer including an electron tunneling dielectric layer formed by chemical deposition dielectric layer (high-temperature CVD oxide) or a thermal oxide layer.

9. The method as claimed in claim 1, wherein, the step (14) includes forming the third polysilicon layer outside the first pattern opening and the second pattern opening, and the third polysilicon layer between the first pattern opening and the second pattern opening is a floating gate (FG).

10. The method as claimed in claim 1, wherein, the step (11) includes:
(14-1) removing a portion of the third polysilicon layer by defining a photoresist as a mask with lithography, and removing the third polysilicon layer nearby the first polysilicon layer and faraway from the second polysilicon layer.

11. The method as claimed in claim 1, wherein, the step of defining a first dielectric layer includes the third capping dielectric layer on the substrate and the base dielectric layer under the damascene trench.

12. The method as claimed in claim 1, wherein, the step of defining a second dielectric layer includes the third capping dielectric layer on the upper surface and the sidewall of the damascene trench, and the erase gate (EG) and the select gate (SG) are wrapped in the second dielectric layer.

13. A non-volatile memory component, comprising:
a substrate having a surface nearby a source region and a drain region, and there is a channel region between the source region and the drain region;
a first dielectric layer, formed on the substrate; wherein an erase gate (EG), a select gate (SG) and a floating gate (FG) are formed on the first dielectric layer, the erase gate (EG) is located above the source region while the select gate and the floating gate are located at the upper projection area of the channel region in the depth direction;
a second dielectric layer, formed on the first dielectric layer and wraps the erase gate (EG) and the select gate (SG) in; wherein the floating gate (FG) is located between the adjacent second dielectric layers;
a coupling dielectric layer, covering the second dielectric layer and the floating gate (FG) unevenly; and
a coupling gate (CG), formed on the coupling dielectric layer;
wherein, the first dielectric layer includes a first thickness within the first pattern opening, the first dielectric layer includes a second thickness under the projection area of the floating gate (FG) in the depth direction, and the first dielectric layer includes a third thickness under the projection region of the select gate (SG) in the depth direction; wherein, the first thickness is thicker than the second thickness, and the second thickness thicker than the third thickness.

14. The non-volatile memory component as claimed in claim 13, wherein, a first capping dielectric layer is formed between the second dielectric layer and the select gate (SG), while a second capping dielectric layer is formed between the second dielectric layer and the erase gate (EG), and the first capping dielectric layer includes a first capping thickness while the second capping dielectric layer includes a second capping thickness, the first capping thickness is thicker than the second capping thickness.

15. The non-volatile memory component as claimed in claim 13, further comprising a bit-line contact formed on the drain region, the bit-line contact passing through the first dielectric layer and the coupling dielectric layer, and the bit-line contact being far away from the substrate in the depth direction for external connection.

16. The non-volatile memory component as claimed in claim 13, wherein, the second dielectric layer is located at the two side of the erase gate (EG) and the select gate (SG), the second dielectric layer is formed toward the direction away from the center of the erase gate (EG) and the select gate (SG) individually.

17. The non-volatile memory component as claimed in claim 13, wherein:
the coupling dielectric layer is located in the upper projection area of the erase gate (EG), the floating gate (FG) and the select gate (SG) unevenly and continuously; and
the coupling dielectric layer formed on the floating gate (FG) is nearby the first dielectric layer in the depth direction.

18. The non-volatile memory component as claimed in claim 13, wherein the first dielectric layer includes a second pattern opening, and the second pattern opening is used to define the select gate (SG) in the depth direction.

19. The non-volatile memory component as claimed in claim 13, wherein the first dielectric layer includes a third pattern opening and the third pattern opening is used to define the drain region in the depth direction.

20. The non-volatile memory component as claimed in claim 13, wherein the select gate includes a spacer formed on the two sides of the select gate (SG) within the second pattern opening, and the spacer is electrical isolation.

* * * * *